(12) United States Patent
Yasui

(10) Patent No.: US 7,713,588 B2
(45) Date of Patent: May 11, 2010

(54) METHOD AND DEVICE OF FORMING A PIEZO-ELECTRIC FILM

(75) Inventor: Motohiro Yasui, Nagoya (JP)

(73) Assignee: Brother Kogyo Kabushiki Kaisha (JP)

( * ) Notice: Subject to any disclaimer, the term of this patent is extended or adjusted under 35 U.S.C. 154(b) by 1309 days.

(21) Appl. No.: 11/179,667

(22) Filed: Jul. 13, 2005

(65) Prior Publication Data

US 2006/0010687 A1 Jan. 19, 2006

(30) Foreign Application Priority Data

Jul. 13, 2004 (JP) ............................. 2004-206086

(51) Int. Cl.
*B05D 1/02* (2006.01)
*B05D 5/12* (2006.01)
*B21D 53/76* (2006.01)
*B05D 3/12* (2006.01)

(52) U.S. Cl. .................. 427/421.1; 29/890.1; 427/100; 427/337; 427/255.5; 427/561; 427/562; 427/568; 427/586; 427/596; 427/597

(58) Field of Classification Search .............. 427/421.1; 29/890.1
See application file for complete search history.

(56) References Cited

U.S. PATENT DOCUMENTS

| | | | | |
|---|---|---|---|---|
| 5,820,948 | A * | 10/1998 | Itozaki et al. | 427/596 |
| 6,195,504 | B1 * | 2/2001 | Horie et al. | 392/394 |
| 2004/0121084 | A1 * | 6/2004 | Kitani | 427/562 |
| 2004/0132221 | A1 * | 7/2004 | Kobayashi et al. | 438/3 |
| 2005/0012790 | A1 | 1/2005 | Kobayashi et al. | |

(Continued)

FOREIGN PATENT DOCUMENTS

JP 10-202171 8/1998

(Continued)

OTHER PUBLICATIONS

Schroth, A. et al., "Properties and Application of Jet Printed Piezoelectric PZT Film for Actuation Purposes." 1997 International Symposium on Micromechanics and Human Science. pp. 67-72 Nagoya, Japan.

(Continued)

*Primary Examiner*—Michael Kornakov
*Assistant Examiner*—Alexander Weddle
(74) *Attorney, Agent, or Firm*—Banner & Witcoff, Ltd.

(57) ABSTRACT

A piezo-electric film forming method includes (1) a first moving step of moving a nozzle with respect to a substrate along a first direction to form a first piezo-electric band extending along the first direction, (2) a measuring step of measuring thickness distribution along the width of the first piezo-electric band, (3) a calculating step of calculating a shifting distance based on the thickness distribution, (4) a shifting step of moving the nozzle with respect to the substrate along a second direction by the calculated shifting distance, wherein the second direction intersects with the first direction, and (5) a second moving step of moving the nozzle with respect to the substrate along the first direction to form a second piezo-electric band extending along the first direction. The piezo-electric film is formed such that the first piezo-electric band and the second piezo-electric band are overlapped.

17 Claims, 14 Drawing Sheets

U.S. PATENT DOCUMENTS

2007/0082144 A1 * 4/2007 Hasei et al. .................. 427/466

FOREIGN PATENT DOCUMENTS

| JP | 10202171 A * | 8/1998 |
| JP | 11-348297 | 12/1999 |
| JP | 2000051770 A * | 2/2000 |
| JP | 2001-152360 | 6/2001 |
| JP | 2001348659 A | 12/2001 |
| JP | 2003-321780 | 11/2003 |

OTHER PUBLICATIONS

EP Partial Seach Report in Application No. 05015120.8-2222 dated Sep. 21, 2006.

* cited by examiner (A)

(B)

(E)

(F)

(A)

(B)

(A)

(B)

(A)

(B)

METHOD AND DEVICE OF FORMING A PIEZO-ELECTRIC FILM

CROSS-REFERENCE TO RELATED APPLICATION

This application claims priority to Japanese Patent Application No. 2004-206086, filed on Jul. 13, 2004, the contents of which are hereby incorporated by reference into the present application.

BACKGROUND OF THE INVENTION

1. Field of the Invention

The present invention relates to a method and device for forming a piezo-electric film.

2. Description of the Related Art

Piezo-electric films are used in a variety of fields. One known method of forming a piezo-electric film is an aerosol deposition method (AD method). The AD method uses an aerosol discharging device. The aerosol discharging device discharges a mixture of fine particles containing a piezo-electric material and a gas from a nozzle. In this specification, the term aerosol means fine particles that float and are separated by means of a gas.

In the AD method, a long narrow piezo-electric band will be formed on the surface of a substrate by moving the nozzle that discharges the aerosol along a straight line relative to the substrate. The piezo-electric band has a certain width. Next, a second long narrow piezo-electric band will be formed next to the previously formed piezo-electric band. Then a third long narrow piezo-electric band will be formed next to the second piezo-electric band. By repeating the process of forming a new piezo-electric band next to the previously formed piezo-electric band, a piezo-electric film composed of a plurality of piezo-electric bands can be formed on the surface of the substrate. Note that in Japanese Patent Application Publication No. 2001-152360, a method is disclosed in which the AD method is employed to form the piezo-electric film.

BRIEF SUMMARY OF THE INVENTION

The size of the piezo-electric effect of a piezo-electric film depends upon the thickness of the piezo-electric film. The piezo-electric effect will be large when a piezo-electric film is thick, and the piezo-electric effect will be small when a piezo-electric film is thin. In the case where the thickness of a piezo-electric film is not uniform, there will be a portion that has a large piezo-electric effect and a portion that has a small piezo-electric effect within one piezo-electric film. This cannot be said to be a high quality piezo-electric film. Piezo-electric films having a uniform thickness are in demand in a variety of fields.

However, there will be a large amount of aerosol discharged from the central portion of the nozzle, and a small amount of aerosol discharged from the edge portions of the nozzle. Because of this, the central portion along the width of a piezo-electric band corresponding to the central portion of the nozzle will be thick, and the edge portions along the width of the piezo-electric band corresponding to the edge portions of the nozzle will be thin. Thus, when two adjacent piezo-electric bands are to be formed so as not to overlap widely, the piezo-electric film will be thinner near the border of the two adjacent piezo-electric bands than the other portions. In other words, concave and convex portions will be produced in the piezo-electric film. In order to solve this problem, the present inventors created technology that causes the widths of two adjacent piezo-electric bands to overlap with each other to an appropriate degree. When the size of the overlapping width of the two piezo-electric bands is set to an appropriate value, the thickness of the piezo-electric film can be made uniform.

By partially overlapping two adjacent piezo-electric bands, the thickness of the piezo-electric film can be made uniform to a certain degree. However, the present inventors discovered that the amount of aerosol that is discharged from the nozzle will change over time due to a variety of factors. In the case where the size of the overlapping width of two adjacent piezo-electric bands is to be maintained at a fixed value, it is not possible to follow the changes in the amount of aerosol over time. Because of this, the thickness of the piezo-electric film cannot be form uniform with good precision.

The technology disclosed by means of the present specification was created by considering the actual situation noted above. An object of the present technology is to form a piezo-electric film of a uniform thickness.

The piezo-electric film forming method disclosed by means of the present specification will form a piezo-electric film on a surface of a substrate by discharging a mixture of fine particles containing gas and piezo-electric material from a nozzle to the surface of the substrate.

One method disclosed by means of the present specification includes a first moving step of moving a nozzle discharging a mixture with respect to the substrate along a first direction. The first moving step is performed to form a first piezo-electric band extending along the first direction with a certain width. The first direction extends within a plane that is parallel with the surface of the substrate.

The present method further includes a measuring step of measuring the thickness distribution along the width of the first piezo-electric band, and a calculating step of calculating a shifting distance based on the thickness distribution measured by the measuring step.

The present method further includes a shifting step of moving the nozzle with respect to the substrate along a second direction by the calculated shifting distance. The second direction may extend within a plane that is parallel with the surface of the substrate. The second direction may intersect with the first direction.

The present method further includes a second moving step of moving the nozzle discharging the mixture with respect to the substrate along the first direction. The first moving step is performed to form a second piezo-electric band extending along the first direction with a certain width.

In the present method, the piezo-electric film is formed such that the first piezo-electric band and the second piezo-electric band overlap in the second (width) direction.

The present method measures the thickness distribution along the width of the piezo-electric band previously formed, and then performs feedback in the shifting distance in the shifting step. In other words, the present method adjusts the overlap width of the two overlapping piezo-electric bands, based on the thickness distribution along the width of the piezo-electric bands. According to this method, it is possible to follow the changes in the amount of aerosol discharged from the nozzle over time. Because of this, variations in the thickness of the piezo-electric film can be effectively controlled.

BRIEF DESCRIPTION OF DRAWINGS

FIG. 7(E) shows a plan view of the substrate after the piezo-electric film has been formed.

FIG. 8(A) shows a first piezo-electric band being formed. FIG. 8(B) shows a lateral view of the substrate after piezo-electric bands were formed over substantially the entire substrate. In other words, FIG. 8(B) shows a lateral view of the substrate after a piezo-electric film has been formed. FIG. 8(C) shows a lateral view of the substrate after another piezo-electric film is formed on top of the piezo-electric film.

FIG. 11(A) shows a plan view of the substrate. FIG. 11(A) shows the movement of the nozzle. FIG. 11(B) shows a plan view of the substrate after a piezo-electric film has been formed thereon.

FIG. 12 shows the movement of the nozzle.

FIG. 13(A) shows a plan view of the substrate FIG. 13(A) shows the movement of the nozzle. FIG. 13(B) shows a plan view of the substrate after a piezo-electric film has been formed thereon.

FIG. 14 serves to describe the movement of the nozzle.

FIG. 15(A) shows a lateral view of the substrate after a piezo-electric film has been formed thereon. FIG. 15(B) shows a lateral view of the substrate after a piezo-electric film has been formed thereon.

DETAILED DESCRIPTION OF THE INVENTION

First Embodiment

A piezo-electric film forming method of a first embodiment will be described with reference to the drawings. The piezo-electric film that is manufactured in the present embodiment will be used in a piezo-electric actuator of an ink jet printer. A piezo-electric actuator that uses a piezo-electric film is disclosed in, for example, US Patent Application Publication No. US2005/0012790 A1. The contents of this patent application publication may be incorporated by reference into the present application.

Figure 1:
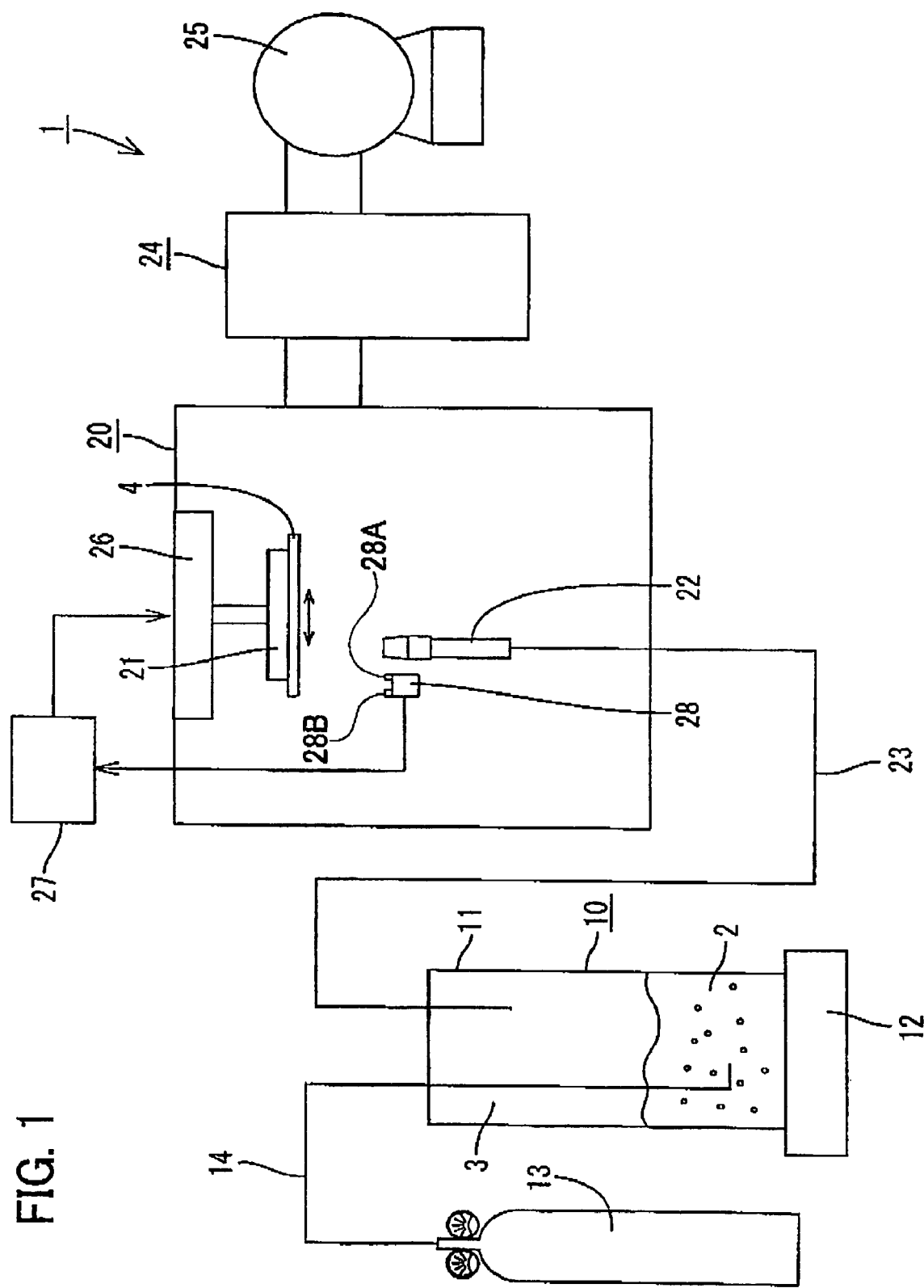
FIG. 1 shows a summary view of a deposition device of a first embodiment.

First, a deposition device for forming the piezo-electric film will be described. A summary view of the deposition device 1 is shown in FIG. 1. The deposition device 1 comprises an aerosol generator 10, a deposition chamber 20, a control device 27, etc. The aerosol generator 10 disperses particles 2 containing a piezo-electric material in a carrier gas to form an aerosol 3. The deposition chamber 20 discharges the aerosol 3 from a nozzle 22 to adhere the piezo-electric material particles 2 to a substrate 4.

The aerosol generator 10 comprises an aerosol chamber 11 capable of accommodating the piezo-electric material particles 2, and an oscillating device 12 that is installed on the lower portion of the aerosol chamber 11. The oscillating device 12 oscillates the aerosol chamber 11. One end of a gas supply pipe 14 is inserted into the aerosol chamber 11. This end is disposed near the bottom surface inside the aerosol chamber 11 so as to be immersed in the material particles 2. The other end of the gas supply pipe 14 is connected to a gas cylinder 13 in which the carrier gas is stored. The carrier gases that can be used are, for example, non-reactive gases such as helium, argon, nitrogen, and the like, and air, oxygen, and the like. In addition, the piezo-electric materials that can be used are lead zirconate titanate (PZT), quartz, lithium niobate, barium titanate, lead titanate, lead metaniobate, zinc oxide, and the like.

The deposition chamber 20 comprises a stage 21, a stage movement mechanism 26, the nozzle 22, a thickness sensor 28, etc. The stage 21 holds the substrate 4. The stage movement mechanism 26 moves the stage 21 in the direction of the arrow in FIG. 1 (left to right) and in a direction perpendicular to the plane of FIG. 1. In this way, the substrate 4 and the nozzle 22 will move with respect to each other. When the substrate 4 moves left to right in FIG. 1, a band formation step (described below) will be executed. When the substrate 4 moves in a direction perpendicular to the plane of FIG. 1, a shifting step (described below) will be performed. The stage movement mechanism 26 is connected to the control device 27. The control device 27 controls the direction of movement of the state movement mechanism 26, the moving distance, the moving speed, the shifting direction, the shifting distance, and the shifting speed.

Figure 2:
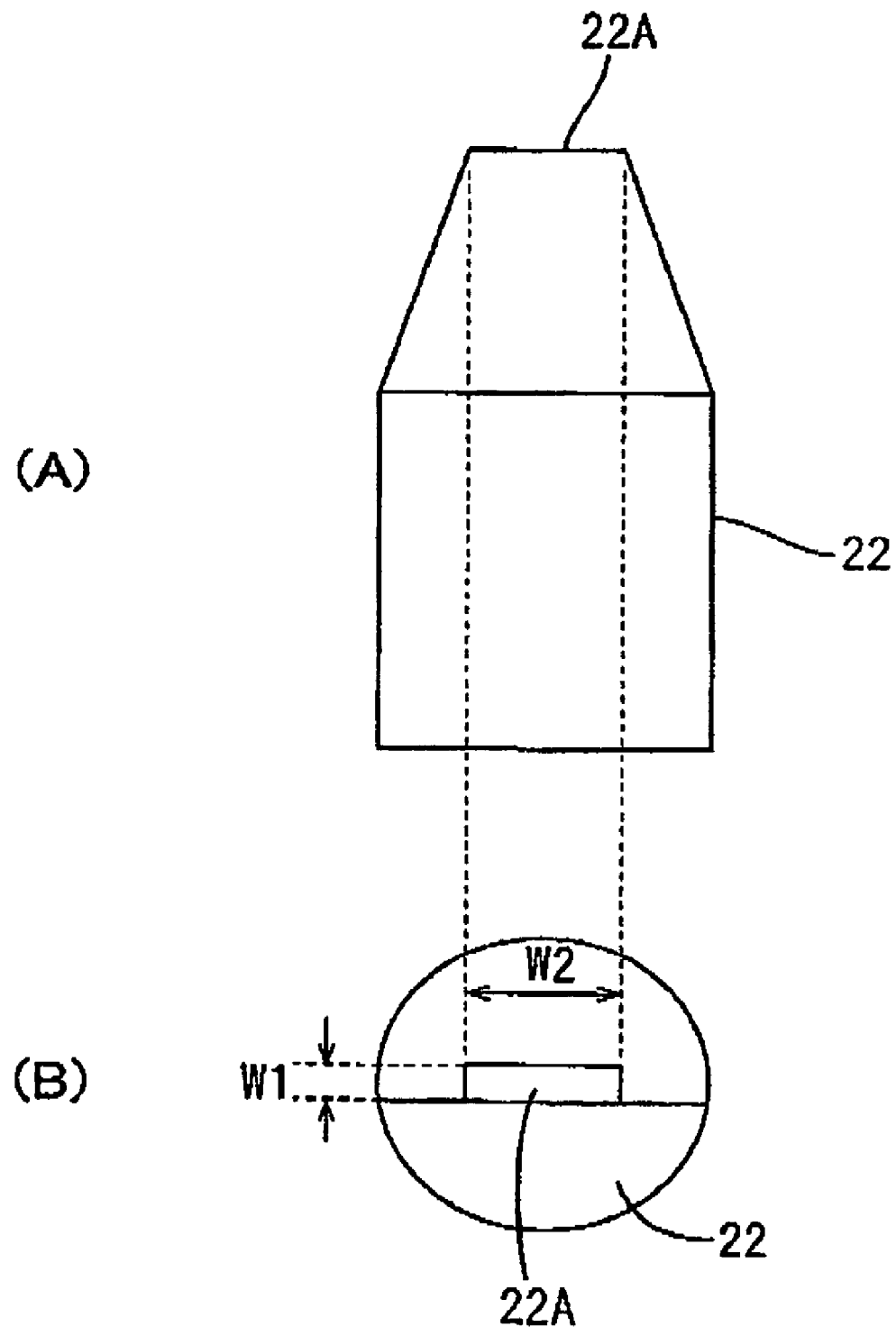
FIG. 2(A) shows a lateral view of a nozzle.
FIG. 2(B) shows a plan view of the nozzle.

The nozzle 22 is disposed below the stage 21. A lateral view of the nozzle 22 is shown in FIG. 2(A), and a plan view of the nozzle 22 is shown in FIG. 2(B). The nozzle 22 has an approximately cylindrical shape. The upper portion of the nozzle 22 becomes narrower toward the tip thereof. A cavity is formed in the interior of the nozzle 22. An opening 22A is provided in the upper surface of the nozzle 22. As clearly shown in FIG. 2(B), the opening 22A has an approximately rectangular shape that extends in the horizontal direction when viewed from above. The size of the vertical width of the opening 22A (the width in the vertical direction of FIG. 2(B)) is W1, and the size of the horizontal width (the width in the horizontal direction of FIG. 2(B)) is W2. As shown in FIG. 1, the nozzle 22 is connected to the aerosol chamber 11 via the aerosol supply pipe 23. The aerosol 3 inside the aerosol chamber 11 will be carried through the aerosol supply pipe 23 to the nozzle 22. The aerosol 3 will be discharged from the opening 22A of the nozzle 22.

Note that the horizontal direction of FIG. 1 corresponds to the vertical direction of FIG. 2(B), and the direction perpendicular to the plane of FIG. 1 corresponds to the horizontal direction of FIG. 2(B).

The thickness sensor 28 is a reflectance type photodetector. The thickness sensor 28 is fixed to the nozzle 22 via a member not shown in the drawings. The thickness sensor 28 has a radiation unit 28A and a photoreceptor 28B. The radiation unit 28A radiates light toward the substrate 4. When a piezo-electric band is formed on the substrate 4, the radiated light will be reflected by the piezo-electric band. The photoreceptor 28B receives the reflected light. The thickness of the piezo-electric band can be detected from the position of the light received in the photoreceptor 28B. The thickness sensor 28 will be described below in more detail.

A vacuum pump 25 is connected to the deposition chamber 20 via a particle collection device 24. The interior of the deposition chamber 20 can be reduced in pressure by means of the vacuum pump 25.

When the deposition device 1 is employed, piezo-electric bands will be formed as described below.

First, the substrate 4 is set on the stage 21. Next, the piezo-electric material particles 2 are introduced into the interior of the aerosol chamber 10. Lead zirconate titanate (PZT) can, for example, be used as the piezo-electric material particles 2. The carrier gas will be introduced from the gas cylinder 13 to the aerosol chamber 11. The material particles 2 will rise upward due to the gas pressure of the carrier gas. At this point, the aerosol chamber 11 will be oscillated by the oscillating device 12. In this way, the piezo-electric material particles 2 will be mixed with the carrier gas to produce the aerosol 3.

Next, the pressure inside the deposition chamber 20 will be reduced by means of the vacuum pump 25. A pressure differential will be produced between the aerosol chamber 11 and the deposition chamber 20. The aerosol 3 inside the aerosol chamber 11 will be transported to the deposition chamber 20 by means of this pressure differential. Aerosol 3 that has been accelerated to a high speed will be discharged from the nozzle 22. The piezo-electric material particles 2 that are contained in the aerosol 3 will collide with the substrate 4 and accumulate thereon. In this way, a piezo-electric band will be formed.

Figure 3:
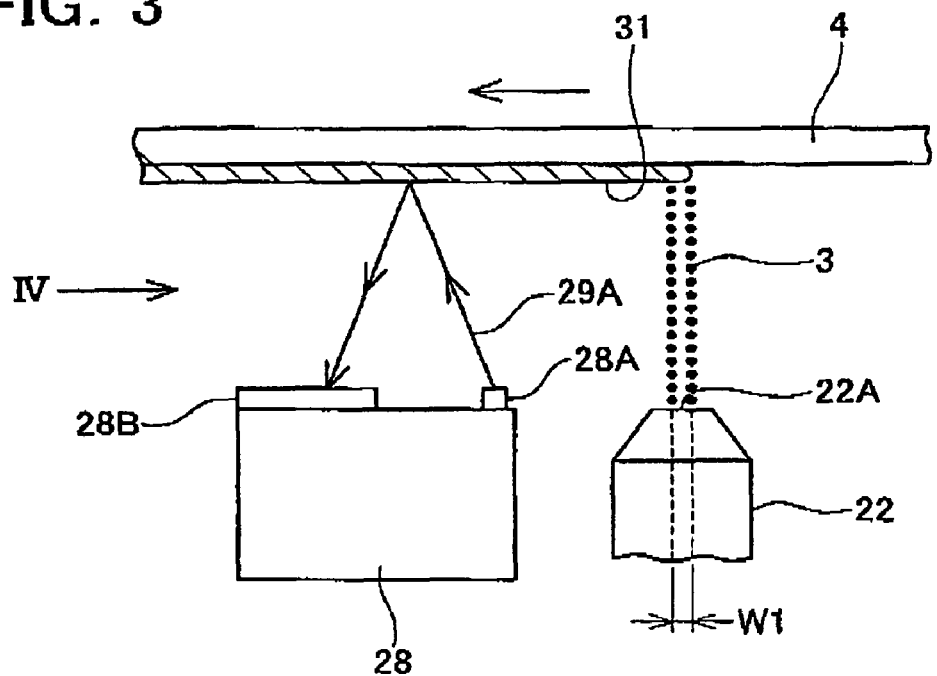
FIG. 3 is a lateral view that schematically shows a substrate, the nozzle, and a thickness sensor.
Figure 5:
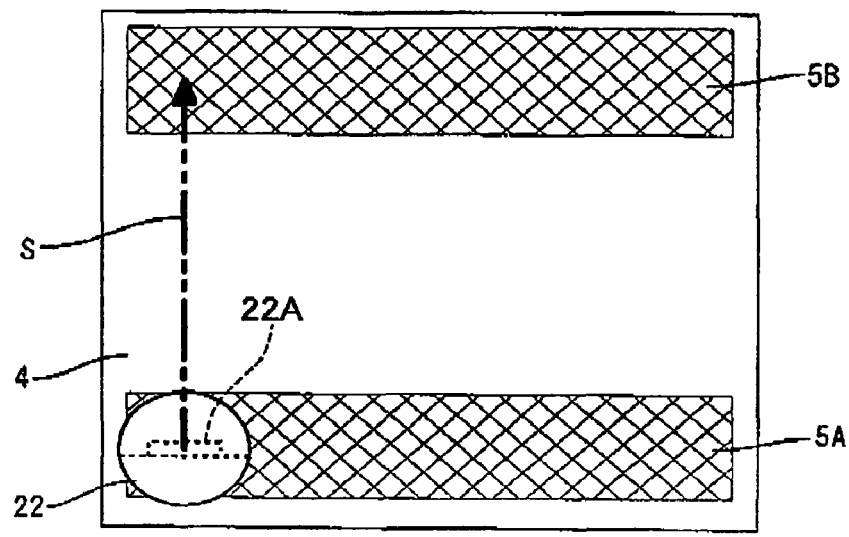
FIG. 5(A) shows a plan view of the substrate prior to a piezo-electric film being formed thereon.
FIG. 5(B) shows a plan view of the substrate after a first piezo-electric band is formed thereon.
Figure 5:
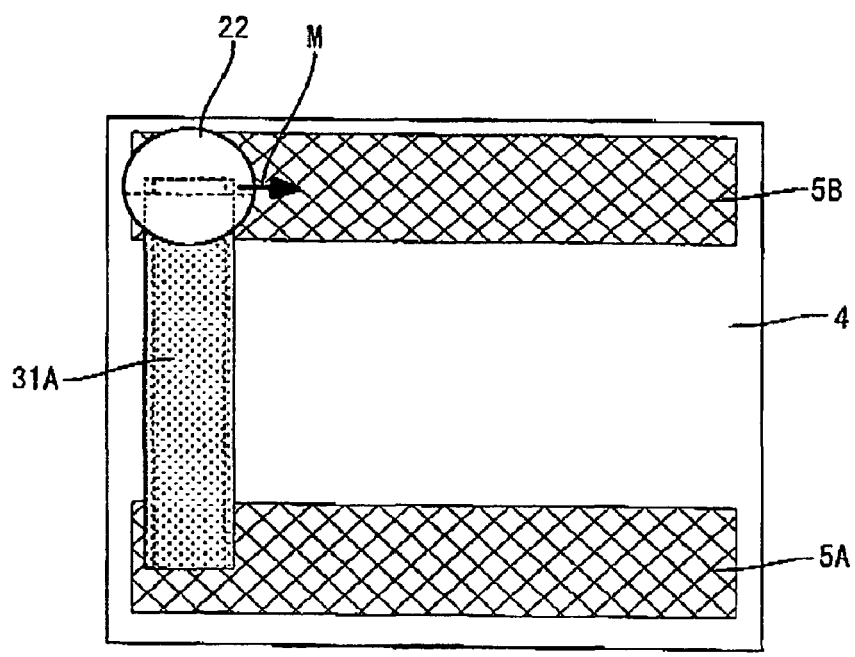

The method of forming the piezo-electric bands will be described in greater detail below. FIG. 3 shows the aerosol 3 being sprayed from the nozzle 22. The nozzle 22 is fixed, and does not move. The stage movement mechanism 26 moves the substrate 4 leftward. In this way, the nozzle 22 and the substrate 4 will move with respect to each other. When the nozzle 22 that discharges the aerosol 3 moves with respect to the substrate 4, a line shaped piezo-electric band 31 can be formed on the substrate 4. The line shape of the piezo-electric band 31A can be clearly seen in FIG. 5(B). FIG. 5(A) shows a plan view of the substrate 4 prior to the formation of the line shaped piezo-electric band 31A. FIG. 5(B) shows a plan view of the substrate 4 after the formation of the line shaped piezo-electric band 31A. Note that the addition of the symbol A to the piezo-electric band 31 in FIG. 5 serves to distinguish it from the piezo-electric band 31 that will be formed later. In the event that the piezo-electric bands do not need to be distinguished, 31 will be used as the reference numeral for the piezo-electric bands.

In the present embodiment, the steps of forming a line shaped piezo-electric band 31 next to another line shaped piezo-electric band 31 will be repeated. This situation can be understood by viewing FIG. 6. The piezo-electric film 30 will be completed by forming a plurality of line shaped piezo-electric bands 31. This situation can be understood by viewing FIG. 7.

Figure 4:
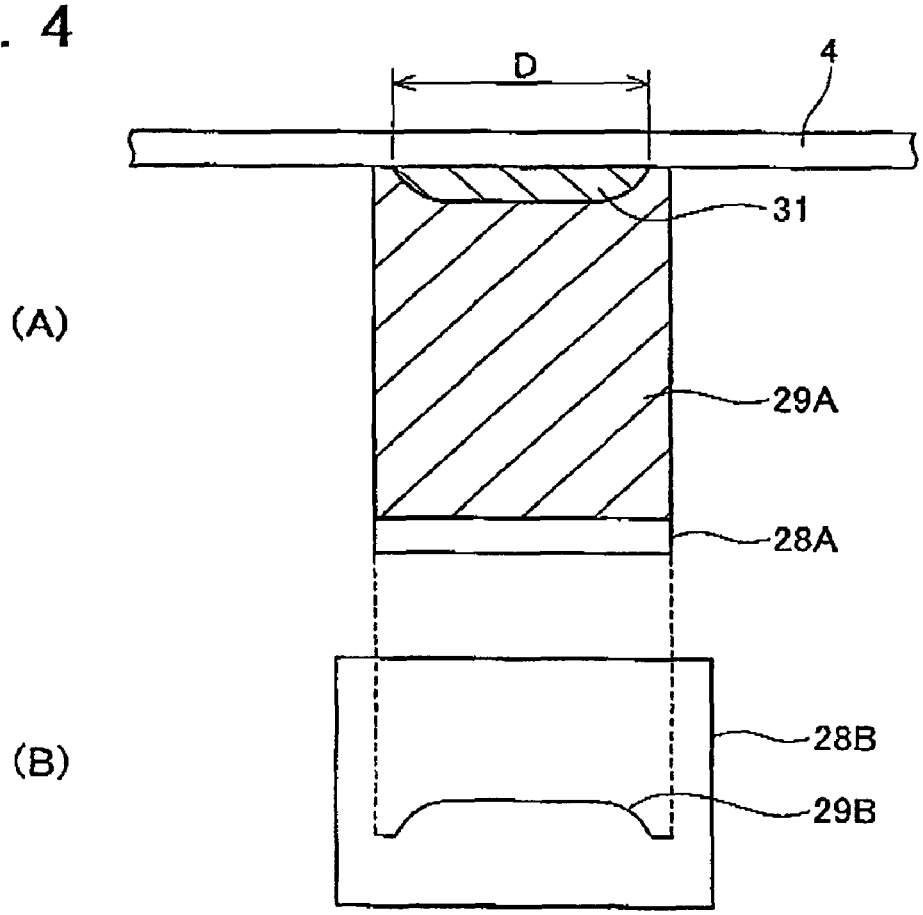
FIG. 4(A) shows the substrate viewed from the IV direction of FIG. 3. A situation in which a light is being radiated onto a piezo-electric band is shown.
FIG. 4(B) shows a plan view of a photoreceptor of the thickness sensor.

Next, a method of measuring the thickness distribution by means of the thickness sensor 28 will be described. As shown in FIG. 3, the radiation unit 28A of the thickness sensor 28 will radiate a light 29A toward the piezo-electric band 31. FIG. 4(A) simply illustrates the relationship between the radiation unit 28A and the substrate 4 when viewed in the IV direction of FIG. 3. As can be clearly understood when FIG. 4(A) is viewed, the line shaped light 29A will be radiated such that the line shaped light 29A spans the horizontal width D of the piezo-electric band 31. The light 29A radiated toward the piezo-electric band 31 will be reflected by the piezo-electric band 31. The light 29A reflected by the piezo-electric band 31 will be received by the photoreceptor 28B. When the thickness of the piezo-electric band 31 varies, the position of the light 29A received in the photoreceptor 28B will vary. FIG. 4(B) shows a plan view of the photoreceptor 28B that receives the light reflected by the piezo-electric band 31 shown in FIG. 4(A). The photoreceptor 28B is a type in which the photoreceptor element is arranged in two dimensions. As shown in FIG. 4(B), if the piezo-electric band 31 is approximately trapezoid shaped, the photoreception line 29B in the photoreceptor 28B will also be approximately trapezoid shaped. If the thickness sensor 28 of the present embodiment is used, the thickness distribution of the piezo-electric band 31 can be accurately measured. The shape of the photoreception line 29B of the photoreceptor 28B will be accepted by the control device 27 (see FIG. 1). In this way, the control device 27 can obtain the thickness distribution of the piezo-electric band 31.

Next, the method of forming the piezo-electric film will be described in greater detail with reference to FIGS. 5 to 10.

(1) First, the substrate 4 will be prepared. Mask members 5A, 5B will be arranged on the substrate 4 (FIG. 5(A)). The mask member 5A is arranged slightly upward from the lower edge of the substrate 4. The mask member 5B is arranged slightly downward from the upper edge of the substrate 4. The mask members 5A, 5B are arranged across substantially the entire area of the substrate 4 in the horizontal direction. The substrate 4 on which the mask members 5A, 5B are arranged is fixed to the stage 21. At this point, the surface on which the mask members 5A, 5B are arranged faces downward in FIG. 1.

(2) The nozzle 22 will be arranged on the left lower portion of the substrate 4 (FIG. 5(A)). In this position, the opening 22A of the nozzle 22 and the mask member 5A overlap in a planar manner. This step is executed by the control device 27 driving the stage movement mechanism 26.

(3) Next, the piezo-electric material particles 2 are introduced into the interior of the aerosol chamber 11. The carrier gas of the gas cylinder 13 will be introduced to the aerosol chamber 11. The material particles 2 will rise upward due to the gas pressure of the carrier gas. Simultaneously therewith, the aerosol chamber 11 will be oscillated by the oscillating device 12. In this way, the piezo-electric material particles 2 will be mixed with the carrier gas to produce the aerosol 3. The pressure inside the deposition chamber 20 will be reduced by means of the vacuum pump 25. The aerosol 3 inside the aerosol chamber 11 will be transported to the deposition chamber 20. The aerosol 3 will be discharged from the nozzle 22.

(4) When the aerosol 3 is to be discharged in the aforementioned step (3), the substrate 4 will be moved downward in FIG. 5. In this way, the nozzle 22 will move with respect to the substrate 4 along arrow S in FIG. 5(A). This step is executed by the control device 27 driving the stage movement mechanism 26. The substrate 4 will move to a position in which the nozzle 22 and the mask member 5B overlap in a planar manner. When this step is complete, the line shaped piezo-electric band 31A is formed on the substrate 4 (FIG. 5(B)).

(5) The thickness distribution along the width of the piezo-electric band 31A will be measured while the aforementioned step (4) is being executed. The radiation unit 28A will radiate light toward the piezo-electric band 31A. A line shaped light that extends in the horizontal direction of FIG. 5 will be radiated so as to span the piezo-electric band 31A. The light reflected by the piezo-electric band 31A will be received by the photoreceptor 28B. The control device 27 will accept the photoreception line of the photoreceptor 28B. In this way, the control device 27 can obtain the thickness distribution of the piezo-electric band 31A.

(6) When the control device 27 obtains the thickness distribution, it will determine the size of the overlap width of two adjoining piezo-electric bands 31. This process is executed after a first piezo-electric band 31A is completed. How the control device 27 determines the overlap width will be described with reference to FIG. 9.

The control device 27 will input the thickness distribution (S2). When the thickness distribution is input, it will be determined whether the type of thickness distribution is a trapezoid shape or mountain shape. For example, a trapezoid shaped piezo-electric band 31 is shown in FIG. 8(A). In addition, for example, a mountain shape piezo-electric band 31 is shown in FIG. 10(A). The process of S4 will determine whether or not a straight portion of a predetermined length or longer is included in the central portion of the thickness distribution. In other words, when a straight portion of a predetermined length or longer is included in the central portion of the thickness distribution, the process will determine that the shape is a trapezoid. In this situation, the process will proceed to S12. In addition, when a straight portion of a predetermined length or longer is not included in the central portion of the thickness distribution, the process will determine that the shape is a mountain. In this situation, the process will proceed to S6.

In Step S6, it will be determined how many peaks are present. When there is one peak, the process will proceed to S8, and will determine that the overlap width is to be 50%. Normally, a peak will appear in the center of the thickness distribution. If the overlap width of adjacent piezo-electric bands 31 is set to 50%, the thin portion of the piezo-electric band 31 (edge portion) will be stacked on top of the thick portion of the other piezo-electric band 31 (center portion). Because of this, the variations in the thicknesses of two adjacent piezo-electric bands 31 will be offset. The thickness of a piezo-electric film composed of a plurality of piezo-electric bands 31 can be made uniform. Note that in S8, the size of the width of the piezo-electric band 31 will also be measured. The size of the width of the piezo-electric band 31 is the size shown by the symbol D in FIG. 4(B).

On the other hand, there may be times in which there are two peaks due to the shape of the opening 22A of the nozzle 22 or due to other causes. In this situation, the process will proceed from S6 to S10, and will determine that the overlap width is to be 33%. When there are two peaks, the peas will normally appear on a portion that is ⅓ from one edge of the thickness distribution and ⅓ from the other edge thereof. If the overlap width is 33%, the thin portion of one piezo-electric band 31 will be stacked on top of the other piezo-electric band 31. Because of this, the variations in the thicknesses of two adjacent piezo-electric bands 31 will be canceled. The thickness of a piezo-electric film can be made uniform. Note that when there are two peaks, the overlap width may be set to 66%. Even in this situation, the thickness of a piezo-electric film can be made uniform. Note that in S10, the size of the width of the piezo-electric band 31 will also be measured.

In the present embodiment, only a thickness distribution having one or two mountain shapes is dealt with. However, a thickness distribution having three or more mountain shapes can also be dealt with.

If it is determined in S4 that the thickness distribution has a trapezoid shape, the process will proceed to S12. In S12, the overlap width of adjacent piezo-electric bands 31 will be calculated. More specifically, the overlap width will be calculated as described below. A piezo-electric band 31 having a thickness distribution that is trapezoid shaped is shown in FIG. 8(A). In S12, the length D2 of the central straight portion of the trapezoid shaped piezo-electric band 31 and the length D1 of both edge portions will be measured. D2 is the size of the width of the thick portion in the center of the piezo-electric band 31. D1 is the size of the width of the thin portions on both edges of the piezo-electric band 31. In the present embodiment, the size of D1 will determine the overlap width.

Note that as shown in FIG. 8(A), the aerosol 3 will be discharged in an area that is wider than the horizontal width W2 of the nozzle opening 22A. Because of this, the width of the piezo-electric band 31 to be formed will be slightly larger than the horizontal width W2 of the opening 22A. Both edge portions of the piezo-electric band 31 are slightly thin. In order to reduce the variations in the thickness, it is preferred that the relative moving speed of the nozzle 22 be as fast as possible in the area in which the piezo-electric material particles 2 can be completely adhered to the substrate 4. In this situation, the piezo-electric band 31 will be thin. When the piezo-electric band 31 is thin (about 0.01 μm to 0.5 μm), the variations in the thickness will be reduced.

Figure 8:
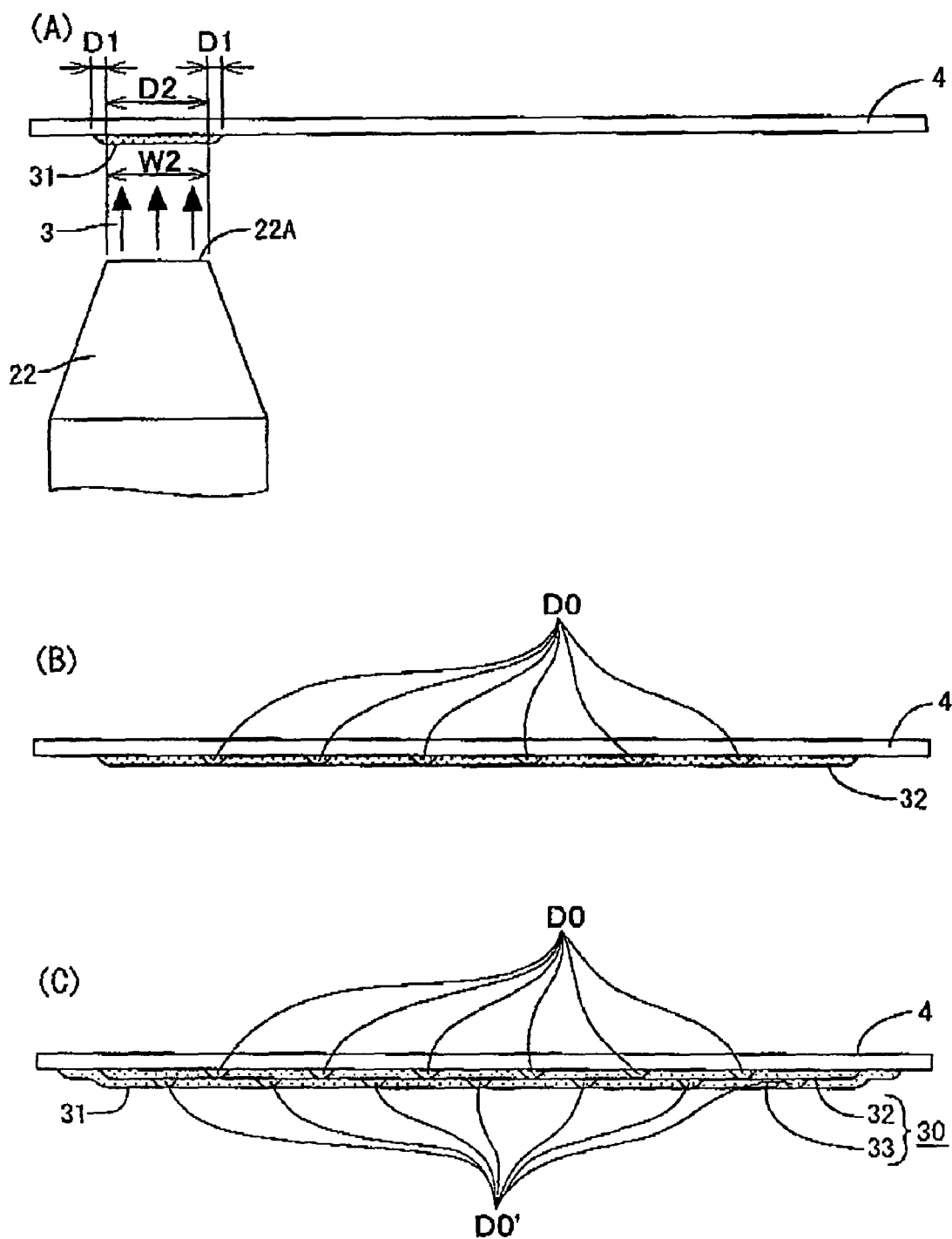
FIG. 8 shows a lateral view of a piezo-electric film forming method of the first embodiment.
Figure 9:
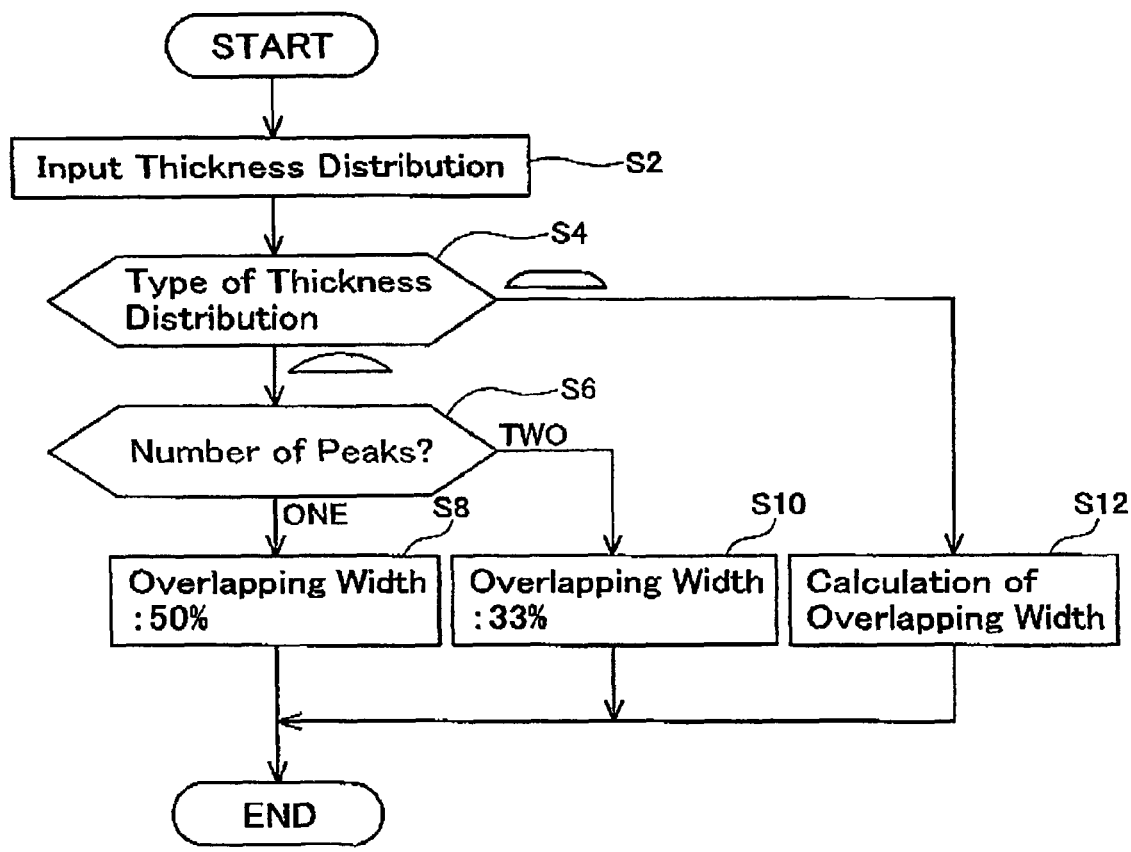
FIG. 9 is a flowchart of the process that a control device executes in order to determine the overlap width of two adjacent piezo-electric bands.

(7) When the overlap width is determined, the shifting distance of the substrate 4 and the nozzle 22 will then be calculated. In other words, a distance M of FIG. 5(B) will be determined. More specifically, the distance M will be determined as described below. When S8 of FIG. 9 is executed, the size of the width of the piezo-electric band 31 will be multiplied by 50%. The value obtained is the distance M. When S10 of FIG. 9 is executed, the size of the width of the piezo-electric band 31 will be multiplied by 67%. The value obtained is the distance M. In addition, when S12 of FIG. 9 is executed, the length D2 of the central portion and the lengths D1 of the edge portions will be added together D1+D2), and the sum will be the distance M (see FIG. 8(A)).

(8) The control device 27 will shift the substrate 4 to the left of FIG. 5(B) by only the distance M that was determined. In this way, the nozzle 22 will move to the right relative to the substrate 4. When the nozzle 22 moves relative to the substrate 4, it will be in the state shown in FIG. 6(C). FIG. 6(C) shows a diagram of when the thickness distribution of a trapezoid shape is obtained.

Note that step (8) will be referred to below as the shifting step. The step of forming one piezo-electric band 31 will be referred to as a band formation step.

In the present embodiment, the aerosol 3 will be discharged from the nozzle 22 while the shifting step is being executed.

Figure 6:
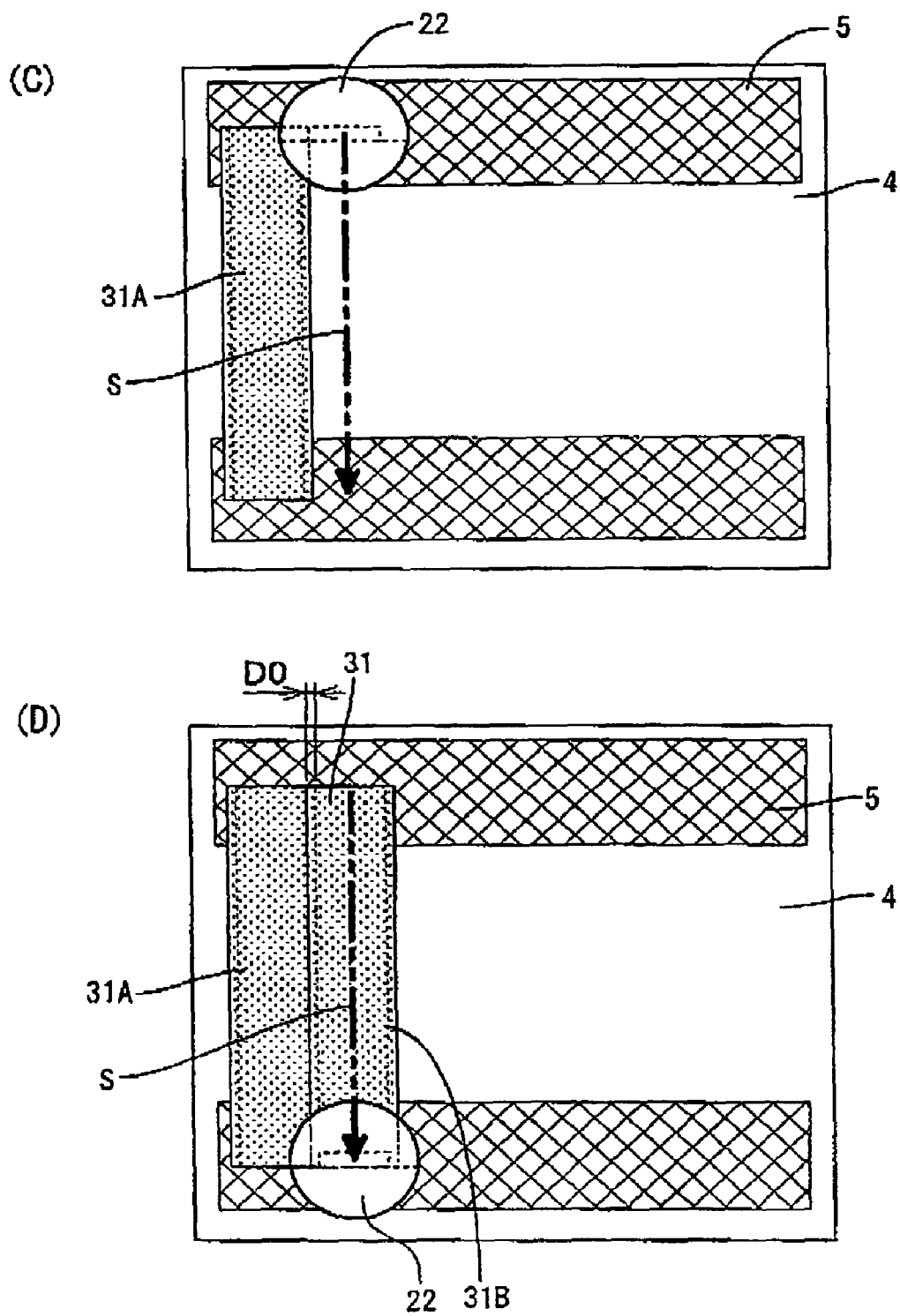
FIG. 6(C) shows a plan view of the substrate after FIG. 5(B). The nozzle is moving to the right with respect to the substrate.
FIG. 6(D) shows a plan view of the substrate after a second piezo-electric band is formed thereon.
Figure 7:
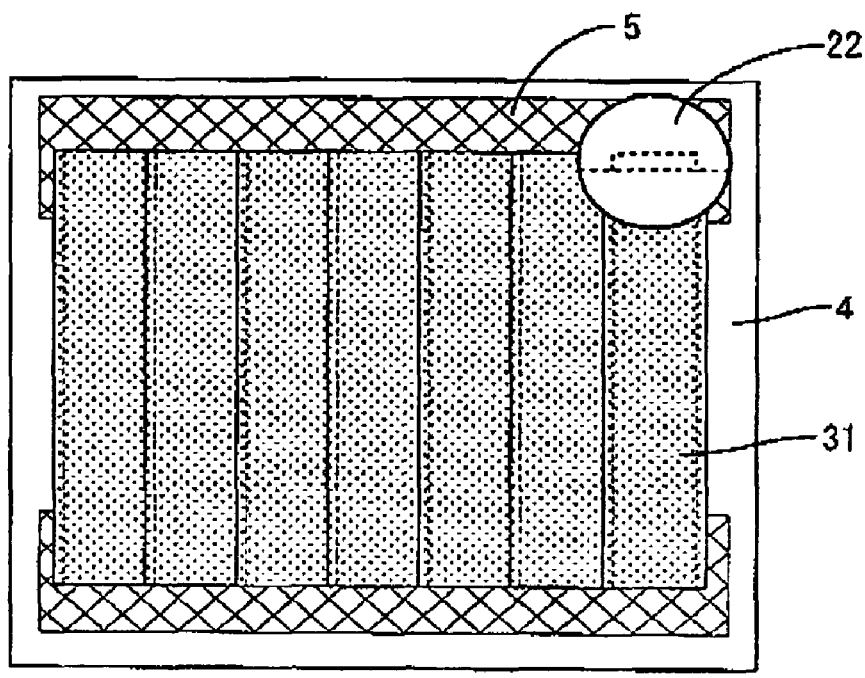
FIG. 7(E) shows a plan view of the substrate after piezo-electric bands were formed over substantially the entire substrate. In other words.
FIG. 7(F) shows a plan view of the substrate after mask members have been removed.
Figure 7:
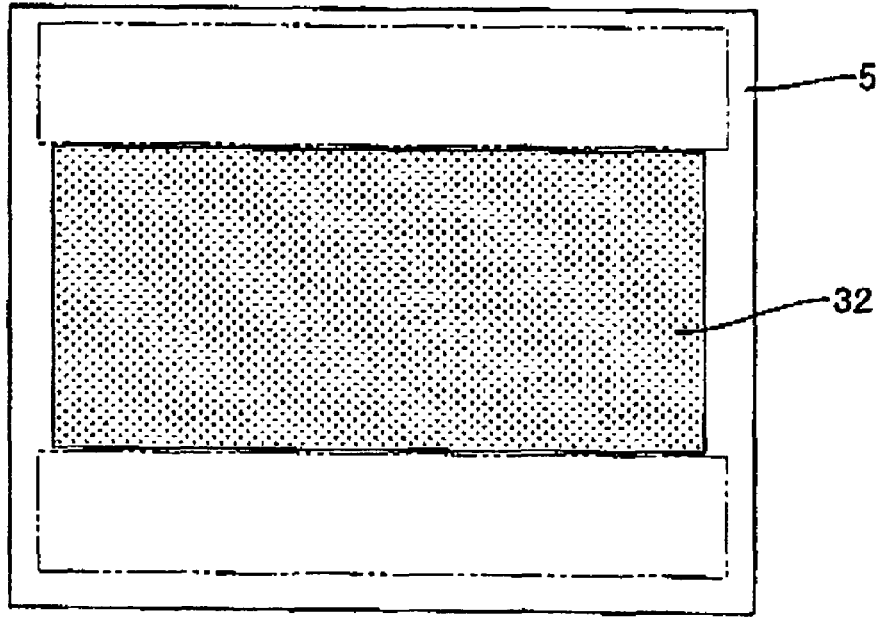

(9) When the substrate 4 is moved to the state shown in FIG. 6(C), a second band formation step will be performed. The substrate 4 will be moved upward (the upward direction of FIG. 6). The nozzle 22 will move relative thereto in the direction of the arrow S of FIG. 6(C). In this way, the piezo-electric band 31A will be formed next to the piezo-electric band 31B (see FIG. 6(D)). The piezo-electric band 31A and the piezo-electric band 31B partially overlap. The overlap portion is designated with the reference numeral D0. The size of D0 of FIG. 6(D) is equal to D1 (see FIG. 8(A)).

The relative moving distance in the shifting step is set to a value that will achieve the determined overlap width. Because of this, the piezo-electric band 31A and the piezo-electric band 31B will overlap by only the determined overlap width.

(10) When the second band formation step is complete, a second shifting step will be performed. In the second shifting step and thereafter, the shifting distance determined in the first shifting step (the aforementioned step (7)) will be used. When the second shifting step is performed, a third band formation step will be performed. The shifting step and the band formation step will be repeatedly performed. In this way, as shown in FIG. 7(E), a plurality of piezo-electric bands 31 will be formed on the surface of the substrate 4.

Next, the mask members 5A, 5B will be removed from the substrate 4 (FIG. 7(F)). In this way, a piezo-electric film 32 composed of a plurality of piezo-electric bands 31 will be completed.

According to the piezo-electric film formation method of the present embodiment, the size of the overlap width of two adjacent piezo-electric bands 31 will be adjusted based upon the thickness distribution of the first piezo-electric band 31 that was formed. The overlap width is adjusted so as to cancel variations in the thickness. Even if the amount of aerosol to be discharged from the nozzle 22 changes each time the piezo-electric film 32 is to be formed, it is possible to follow the change. A piezo-electric film 32 of a uniform thickness can be continuously formed.

In the aforementioned embodiment, mask members 5A, 5B are used. In the shifting step, the aerosol 3 is discharged toward the mask members 5A, 5B. The vertical width W1 of the opening 22A of the nozzle 22 is smaller than the horizontal width W2 thereof. Because of this, the amount of piezo-electric material particles 2 that accumulates in the shifting step will be larger than the amount of piezo-electric material particles 2 that accumulates in the band formation step. In the present embodiment, the mask members 5A, 5B are arranged in the movement path of the nozzle 22 in the shifting step. By removing the mask members 5A, 5B after the formation of piezo-electric film 32, only the portions having a uniform thickness can be remained.

Note that by stacking another piezo-electric film on the surface of the piezo-electric film 32, a stacked piezo-electric film may be formed thereby. FIG. 8 clearly shows this situation. FIG. 8(B) shows the situation after a first piezo-electric layer 32 has been formed.

A piezo-electric film 33 will be formed on top of the first piezo-electric film 32. The piezo-electric film 33 will be produced with the same method as the method of forming the first piezo-electric film 32 described above. However, the relative movement distance in the shifting step will not be calculated again. The relative movement distance determined during the formation of the first piezo-electric film 32 will be used. Note that the relative movement distance in the shifting step (the shifting distance) may be calculated again. In this situation, when a second piezo-electric film 33 is to be formed, the thickness distribution of the first piezo-electric band 31 will be measured, the overlap width will be determined based upon the thickness distribution, and the relative movement distance will be calculated based upon the determined overlap width.

In the present embodiment, the overlap portions D0 of two adjacent piezo-electric bands 31 of the first piezo-electric film 32 will be offset from the overlap portions D0' of two adjacent piezo-electric bands 31 in the second piezo-electric film 33. FIG. 8(C) clearly shows the overlap portions D0 offset from the overlap portions D0'. The control device 27 will adjust the position in which the first piezo-electric bands 31 are formed so that this offset will be achieved. By offsetting in this manner, the concave portions of the second piezo-electric film 32 will not be stacked on top of the concave portions of the first piezo-electric film 32, and the convex portions of the second piezo-electric film 32 will not be stacked on top of the convex portions of the first piezo-electric film 32.

According to the present embodiment, variations in the thickness of the stacked piezo-electric film 30 can be effectively controlled.

Figure 10:
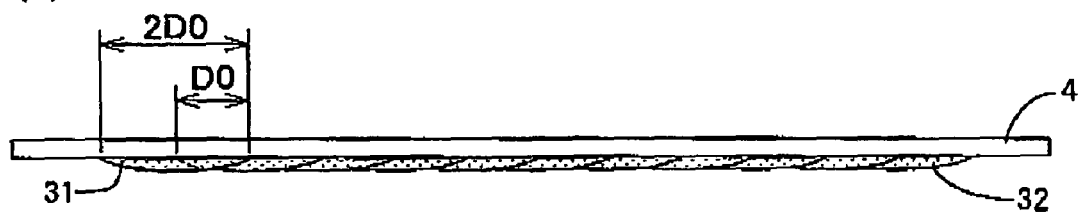
FIG. 10(A) shows a lateral view of the substrate after the piezo-electric film was formed thereon by means of piezo-electric bands having mountain shapes when viewed in cross-section.
FIG. 10(B) shows a lateral view of the substrate after another piezo-electric film is formed on top of the piezo-electric film.
Figure 10:
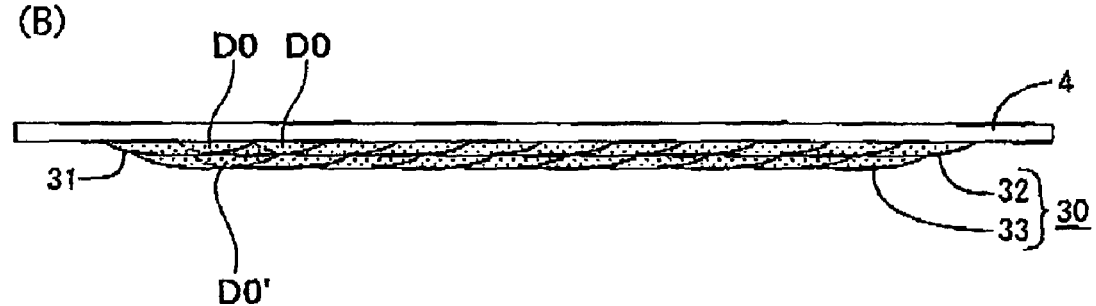

In the embodiment described above, a situation was described in which trapezoid shaped piezo-electric bands 31 are formed. When mountain shaped piezo-electric bands 31 having one peak are formed, the piezo-electric film 32 shown in FIG. 10 will be formed. As shown in FIG. 10(A), the size D0 of the overlap portion of two adjacent piezo-electric bands 31 is set to be half the width of one piezo-electric band 31.

FIG. 10(B) shows a piezo-electric film 30 comprising two piezo-electric films 32, 33. Here also, the overlap portions D0 of two adjacent piezo-electric bands 31 of the first piezo-electric film 32 will be offset from the overlap portions D0' of two adjacent piezo-electic bands 31 in the second piezo-electric film 33. A piezo-electric film 30 having a uniform thickness will be formed.

Second Embodiment

Figure 11:
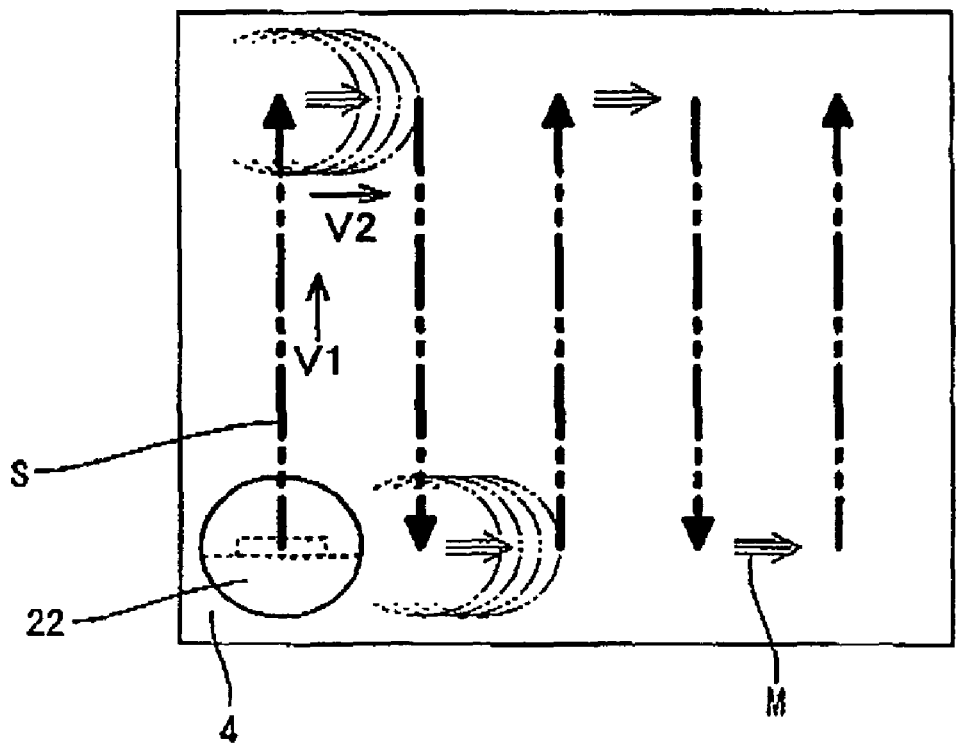
FIG. 11 shows a piezo-electric film forming method of a second embodiment.
Figure 11:
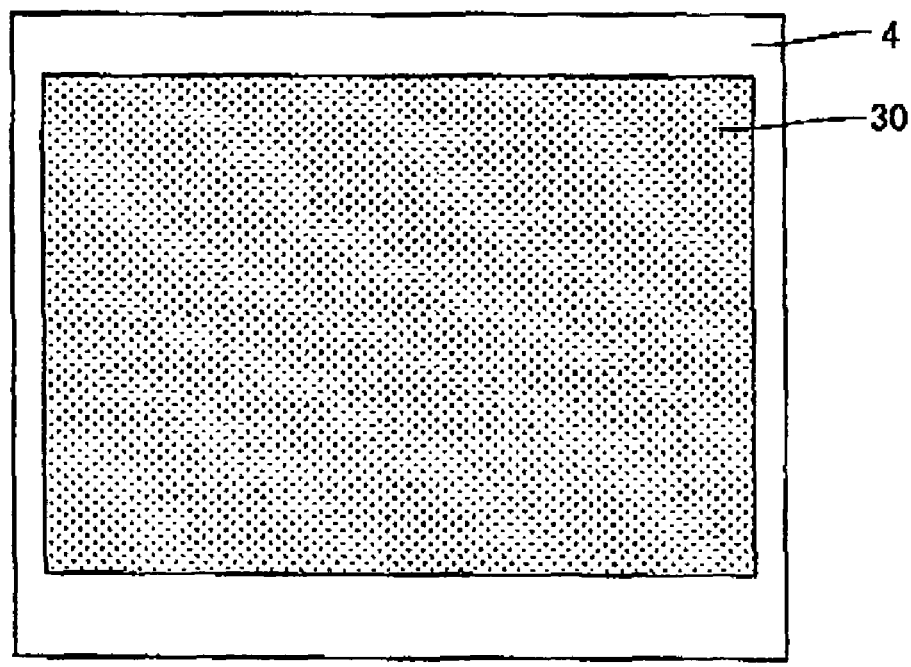

Next, a second embodiment will be described with reference to FIG. 11. Only the points which differ from the first embodiment will be described below. In the present embodiment, the mask members 5A, 5B are not arranged on the substrate 4.

The vertical width W1 of the opening 22A of the nozzle 22 is smaller than the horizontal width W2 thereof (see FIG. 2(B)). Because of this, when the relative movement speed V1 in the band formation step is equal to the relative movement speed V2 in the shifting step, the accumulated quantity in the shifting step will be greater than the accumulated quantity in the band formation step. In this situation, a piezo-electric film 30 of a uniform thickness cannot be formed.

In order to solve the aforementioned problem, in the present embodiment, the relative movement speed V2 in the shifting step is faster than the relative movement speed V1 in the band formation step. The relative movement speed V2 in the shifting step will be the product of W2/W1 multiplied by the relative movement speed V1 in the band formation step. If this is performed, the accumulated quantity in the shifting step can be substantially equal to the accumulated quantity in the band formation step.

According to the present embodiment, a piezo-electric film 30 of a uniform thickness can be formed even if the mask members 5A, 5B are not used.

Third Embodiment

Figure 12:
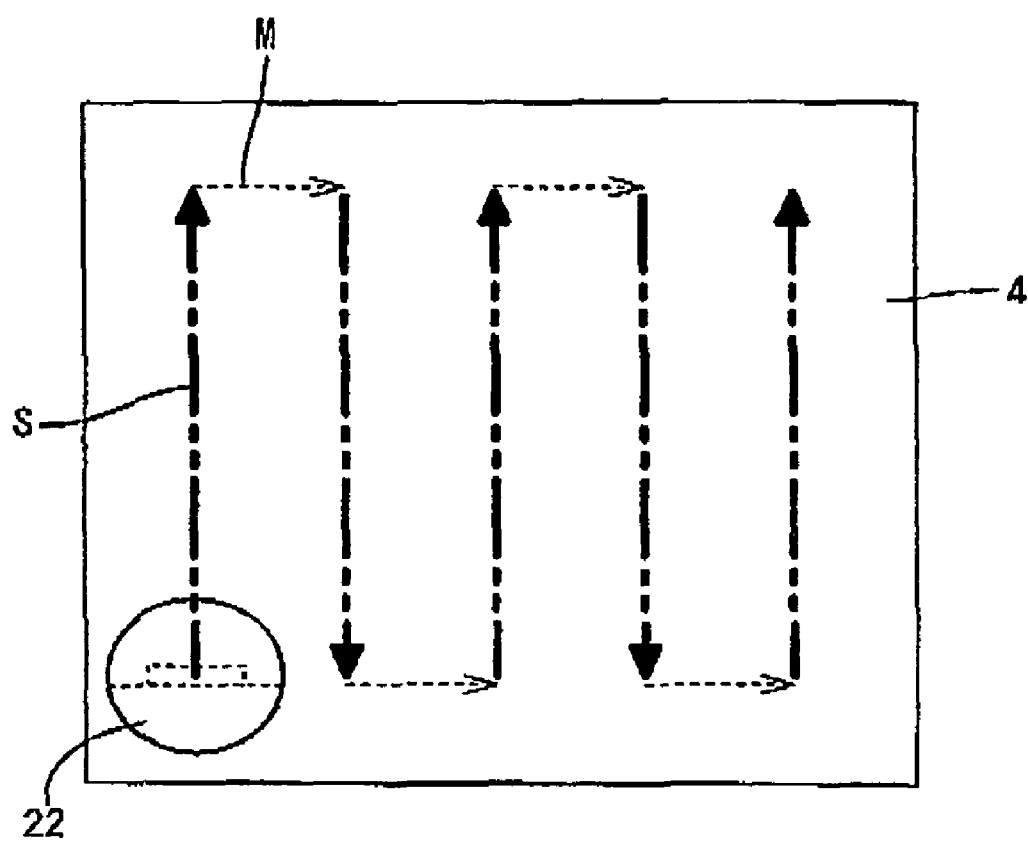
FIG. 12 shows a piezo-electric film forming method of a third embodiment.

Next, a third embodiment will be described with reference to FIG. 12. In the present embodiment, the aerosol 3 will not be discharged from the nozzle 22 during the shifting step.

During the band formation step (during the relative movement of the arrow S in the figure), the aerosol 3 will be discharged from the nozzle 22. However, during the shifting step (during the relative movement of the arrow M in the figure), the spraying of the aerosol 3 will be stopped. In this way, the production of variations in the thickness of the piezo-electric film 30 can be prevented.

According to the present embodiment, a piezo-electric film 30 of a uniform thickness can be formed even if the mask members 5A, 5B are not used.

Fourth Embodiment

Figure 13:
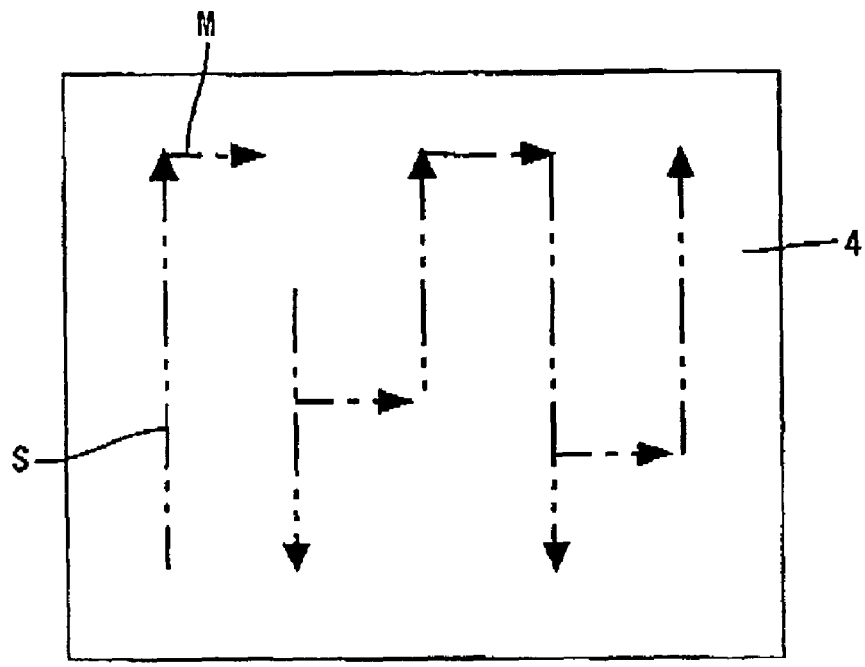
FIG. 13 shows a piezo-electric film forming method of a fourth embodiment.
Figure 13:
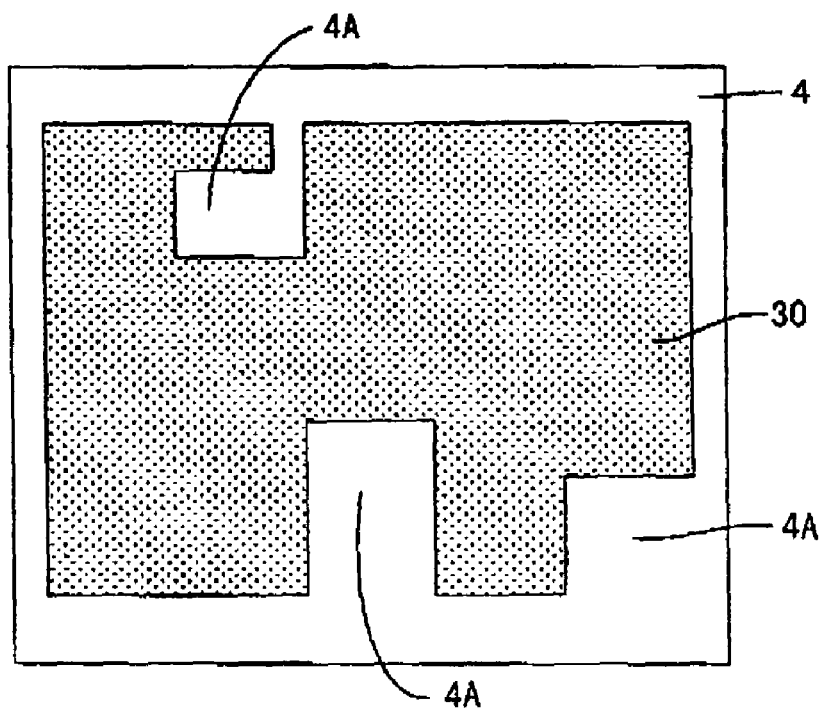

Next, a fourth embodiment will be described with reference to FIG. 13. In each of the aforementioned embodiments, a rectangular piezo-electric film 30 was formed. However, a piezo-electric film 30 having the pattern shown in FIG. 13(B) may also be formed. In this situation, discharge of the aerosol 3 from the nozzle 22 during the formation of the piezo-electric film 30 will be stopped in the unneeded regions 4A. In other words, the aerosol 3 will be discharged in the portions shown with the arrows in FIG. 13(A), and the spraying of the aerosol 3 will be stopped in the portions other than those.

Note that when the spraying of the aerosol 3 is not stopped in the regions 4A, a mask member will be arranged in the regions 4A. Even in this situation, a piezo-electric film 30 of the pattern of FIG. 13 can be formed.

Fifth Embodiment

Figure 14:
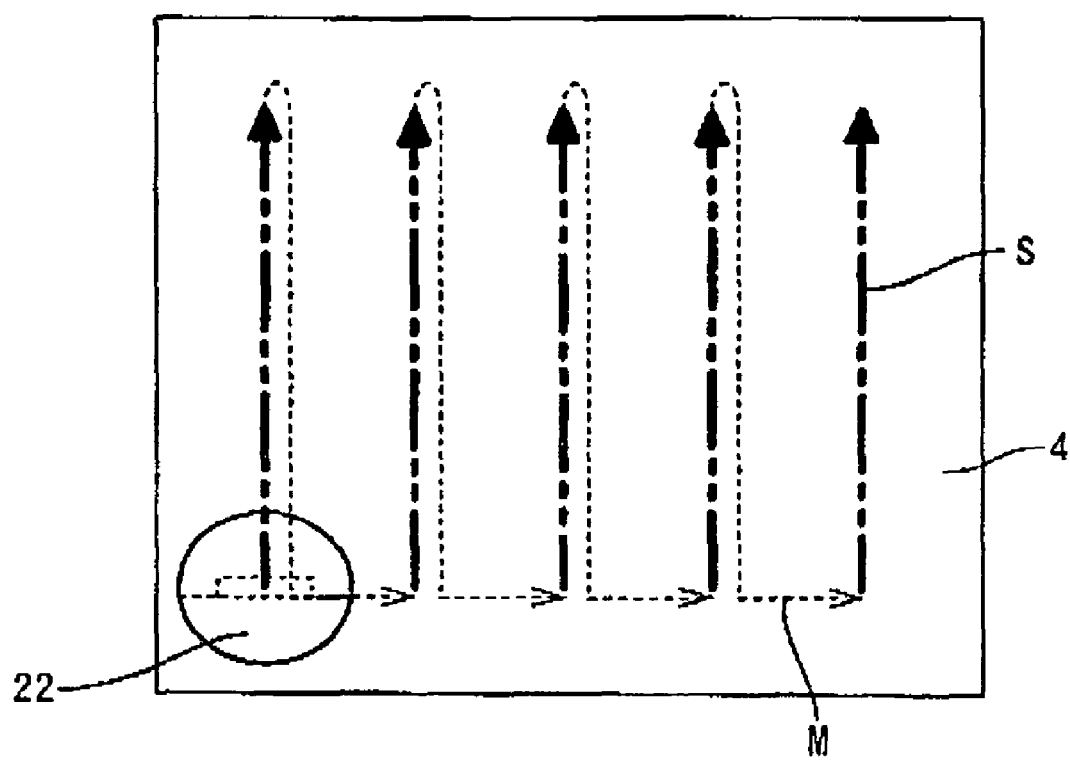
FIG. 14 shows a piezo-electric film forming method of a fifth embodiment. This shows a plan view of the substrate.

In each of the aforementioned embodiments, the relative movement direction in the odd numbered band formation steps and the relative movement direction in the even numbered band formation steps are the reverse of each other. If this is done, a piezo-electric film can be formed with good efficiency. However, as shown in FIG. 14, each time a belt formation step is completed, the nozzle 22 may be returned to the start position. In the process of returning the nozzle 22 to the start position, the spraying of the aerosol 3 will be stopped.

Sixth Embodiment

In the first embodiment, the overlap width is set based upon the thickness distribution of the first piezo-electric band 31, and that overlap width is used in all of the shifting steps thereafter. However, it is also possible for the thickness distribution of each piezo-electric band 31 to be measured, and the relative movement distance in each shifting step to be determined based upon the thickness distribution of each piezo-electric band 31. The relative movement distance in the first shifting step will be determined based upon the thickness distribution of the first piezo-electric band 31. The relative movement distance in the second shifting step will be determined based upon the thickness distribution of the second piezo-electric band 31. The same process will be executed thereafter.

Note that when this embodiment is to be used, the relative movement direction in each band formation step is preferably the same direction (see FIG. 14). This is because the thickness sensor 28 is fixed to one side (the left side) of the nozzle 22 (see FIG. 1). The substrate 4 must be moved with respect to the nozzle 22 in the direction in which the thickness sensor 28 can measure the thickness distribution (the left direction in FIG. 3).

According to the present embodiment, when the amount of aerosol to be discharged from the nozzle 22 changes in each band formation step, it is possible to follow the change. According to the present embodiment, a piezo-electric film 30 having a more uniform thickness can be formed.

Seventh Embodiment

In the present embodiment, a piezo-electric film is respectively formed on a plurality of substrates. In other words, a plurality of piezo-electric films will be manufactured. In the present embodiment, when the first piezo-electric film is to be formed, a step in which the thickness distribution of the piezo-electric band is measured will not be executed. When the first piezo-electric film is to be formed, the overlap width of the adjacent piezo-electric bands is set to a predetermined value.

Figure 15:
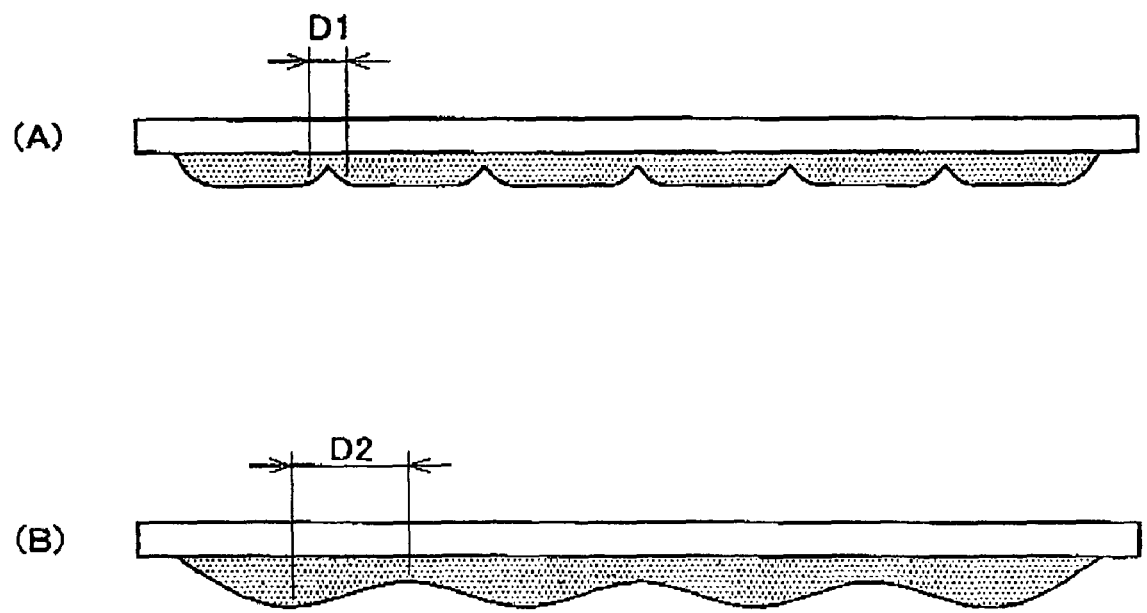
FIG. 15 shows a piezo-electric film forming method of a seventh embodiment.

When the first piezo-electric film is to be formed, the thickness distribution of that piezo-electric film will be measured. The thickness distribution in the adjacent direction of the piezo-electric bands (the relative movement direction in the shifting step) will be measured. Based on the measured thickness distribution, the overlap width of the adjacent piezo-electric bands in the second piezo-electric film will be determined. For example, as shown in FIG. 15(A), when trapezoid shaped piezo-electric bands are formed, the overlap width will be set so that the thin portions D1 will be eliminated. For example, half the value of D1 will be added to the overlap width of the first piezo-electric film, and this value will be the overlap width in the second piezo-electric film formation. In another example, when mountain shaped piezo-electric bands are formed as shown in FIG. 15(B), the distance D2 between the peaks and valleys may be measured, and the overlap width may be set based upon the measured distance. In this situation, the overlap width will be set so that the distance D2 between the peaks and valleys will be reduced. For example, half the value of the distance D2 will be added to the overlap width of the first piezo-electric film, and this value will be the overlap width in the second piezo-electric film formation. Based upon the determined overlap width, the relative movement distance in the shifting step when the second piezo-electric film is to be formed will be calculated. The control device 27 will carry out the calculated relative movement distance. The second piezo-electric film will be formed on the surface of a new substrate. According to this method, the thickness of the second piezo-electric film will be made uniform.

When the second piezo-electric film is to be formed, the thickness distribution of the second piezo-electric film will be measured. Based on the measured thickness distribution, the overlap width of the adjacent piezo-electric bands in the third piezo-electric film formation will be determined. Based upon the determined overlap width, the relative movement distance in the shifting step in the third piezo-electric film formation will be calculated. The control device 27 will carry out the calculated relative movement distance. The third piezo-electric film will be formed on the surface of a new substrate. A fourth piezo-electric film and thereafter will be formed in the same way. Even in the present embodiment, a piezo-electric film having a uniform thickness can be formed.

Note that although the thickness distribution may be measured along the entire area of the piezo-electric film in the present embodiment, it is also possible for the thickness distribution of only one piezo-electric band to be measured. Even in the latter situation, D1 or D2 of FIG. 15 can be measured.

EXAMPLES

Examples of forming a piezo-electric film of a uniform thickness on a wide area will be disclosed. First, the impact of the opening width of the nozzle on the thickness distribution of the piezo-electric band was examined.

Experiment 1

A substrate made of stainless steel (SUS 430) was used. PZT having an average particle diameter of 0.3 to 1 μm was used as the piezo-electric material particles 2. A deposition device identical to the aforementioned embodiments was used. The opening of the nozzle is 5 mm (horizontal width)× 0.5 mm (vertical width). The flow rate of the carrier gas is 2.0 liters/min. The pressure inside the deposition chamber is 150 Pa. The pressure inside the aerosol chamber is 30000 Pa. The type of carrier gas used is helium. The distance between the nozzle and the substrate was set to 10 to 20 mm. The relative movement speed of the nozzle and the substrate was adjusted to a speed in which a 0.15 μm piezo-electric band will be accumulated. When one piezo-electric band is formed, several other piezo-electric bands were stacked thereon. In the end, a 15 μm piezo-electric film was formed.

The piezo-electric film that was formed showed a thickness distribution having one peak in the center thereof. The difference between the largest value and the smallest value of the thickness along the horizontal width of the nozzle was 3 μm.

Experiment 2

A nozzle having a 10 mm×0.4 mm opening was used. The flow rate of the carrier gas was 4.5 liters/min. Other than that, the conditions are the same as in the aforementioned Experiment 1.

The piezo-electric film that was formed showed a thickness distribution having one peak in the center thereof. The difference between the largest value and the smallest value of the thickness along the horizontal width of the nozzle was 7 μm.

From the effects of the aforementioned Experiments 1 and 2, it can be seen that it is difficult to form a film of a uniform thickness when the horizontal width of the opening of the nozzle is large.

A nozzle having a 10 mm×0.4 mm opening was used. As disclosed in the aforementioned first embodiment, a piezo-electric film of 15 μm was formed across the entire surface of a substrate. Because a mountain shaped piezo-electric band having a single peak is formed, the overlap width of two adjacent piezo-electric bands was adjusted to 50%. The other conditions are the same as in the aforementioned Experiment 1 and Experiment 2.

The difference between the thickest portion and the thinnest portion of the piezo-electric film formed in this example was 2 μm. The difference in thickness was extremely small. A piezo-electric film of a uniform thickness could be formed.

The aforementioned embodiments and examples can be modified as follows.

(1) In each of the aforementioned embodiments, the nozzle 22 is fixed and the substrate 4 is moved. However, the substrate 4 may be fixed and the nozzle 22 may be moved. In addition, both the substrate 4 and the nozzle 22 may be moved.

(2) The thickness sensor 28 radiates a line shaped light that spans the piezo-electric band 31. However, the thickness sensor 28 may measure the thickness at any point on the piezo-electric band 31. The thickness distribution can be measured even with this type of sensor. In addition, in the event that the thickness distribution is inferred from the thickness of any one point on the piezo-electric band 31, the thickness sensor 28 may measure the thickness of any one point (e.g., the apex of a mountain shaped piezo-electric band) on the piezo-electric band 31.

(3) Note that in each of the aforementioned embodiments, a second piezo-electric band will be formed on one side of the first piezo-electric band, and a third piezo-electric band will be formed on one side of the second piezo-electric band. In other words, a new piezo-electric band will always be formed in the same direction. However, a second piezo-electric band may be formed on one side of the first piezo-electric band, and a third piezo-electric band may be formed on the other side of the first piezo-electric band.

In this technique, the piezo-electric film forming method comprises the first moving step, the measuring step, the calculating step, the shifting step, and the second moving step. In the present method, a combination of "the shifting step and the second moving step" may be repeatedly executed after the second moving step.

In this situation, after the thickness distribution of the first piezo-electric band is measured and the shifting distance is calculated, the shifting distance will be used to repeat the shifting step. A shifting distance adjusted to the appropriate value can be used to repeatedly execute the steps of forming the piezo-electric band.

In the present method, a measuring step of measuring the thickness distribution along the width of the second piezo-electric band formed in the second moving step may be performed after the second moving step. In this situation, a combination of "the measurement step, the calculating step, the shifting step, and the second moving step" is repeatedly executed after the second moving step.

In this situation, after the thickness distribution is measured along the width of the piezo-electric band formed immediately beforehand, the shifting distance will then be calculated. Even if the distribution of the amount of aerosol discharged from the nozzle changes during the formation of one piezo-electric film, it is possible to follow that change.

The first moving step, the shifting step, and the second moving step may be executed consecutively. For example, if the first direction is horizontal, and the second direction is vertical, the nozzle will repeatedly move so as to form a piezo-electric band while moving to the right, shift to the vertical direction when the right end is reached, then form a piezo-electric band while moving to the left, and shift to the vertical direction when the left end is reached. Wasted movement can be avoided.

A moving step may be executed between the first moving step and the shifting step. This moving step moves the nozzle not discharging the mixture in a direction opposite that of the first moving step.

Using the previously illustrated example, the nozzle will form a piezo-electric band while moving to the right. Discharge of the mixture will stop when the nozzle reaches the right end. The nozzle will return to the left end with the discharge in the stopped state and shift to the vertical direction at the left end. Then the nozzle will again form a piezo-electric band while moving to the right. The formation direction of the piezo-electric bands can be made uniform.

Or, a moving step may be executed between the shifting step and the second moving step that moves the nozzle not discharging the mixture in a direction opposite that of the first moving step.

Using the previously illustrated example, the nozzle will form the piezo-electric band while moving to the right. Discharge of the mixture will stop when the nozzle reaches the right end and will shift to the vertical direction. The nozzle will return to the left end after shifting with the discharge in the stopped state and will again form a piezo-electric band while moving to the right. According to this method as well, the formation direction of the piezo-electric bands can be made uniform.

The nozzle may stop discharging the mixture during the shifting step.

Or, the nozzle may continue to discharge the mixture during the shifting step.

In the latter situations, the nozzle may move above a mask disposed on the substrate during the shifting step. The thickness of the piezo-electric band formed during the shifting step often varies from the thickness of the piezo-electric band formed during the moving step. The mask will be peeled from the substrate after the formation of the piezo-electric film. A piezo-electric band having a non-uniform thickness can be removed from the surface of the substrate.

When the nozzle continuously discharges the mixture during the shifting step, the moving speed of the shifting step may be faster than the moving speed of the first moving step.

The normal opening length of the nozzle is often long in the shifting direction, and short in the first moving direction. When the moving speed of the shifting step is faster than the moving speed of the first moving step, the thickness of the piezo-electric band formed during the shifting step can be close to the thickness of the piezo-electric band formed during the moving step.

In order to improve accuracy, the ratio between the moving speed of the shifting step and the moving speed of the first moving step is preferably determined based on the ratio between the opening length of the nozzle along the second direction and the opening length of the nozzle along the first direction.

The thickness of the piezo-electric band to be formed during the shifting step can come very close to the thickness of the piezo-electric band to be formed during the moving step.

The moving speed of the first moving step and the second moving step is preferably selected such that the thickness of the piezo-electric band to be formed on the surface of the substrate will be 0.01 µm to 0.5 µm. This can form a piezo-electric film of a uniform thickness.

The moving speed of the first moving step is preferably equal to the moving speed of the second moving step.

The calculating step classifies the thickness distribution in accordance with its pattern, and calculates the shifting distance based on the classified pattern.

In particular, the calculating step counts the number of peaks when the thickness distribution is classified into a mountain pattern, and calculates the shifting distance based on the number of peaks counted.

This can adjust the overlap width of the piezo-electric bands to an appropriate value.

The combination of "the shifting step and the second moving step" may be repeatedly executed on the surface of a substrate on which a piezo-electric film has already been formed. In this situation, a piezo-electric film can also be formed in which an upper piezo-electric film is laminated onto a lower piezo-electric film.

The present invention also provides a novel device. The present device comprises a nozzle for discharging a mixture of gas and fine particles to a surface of the substrate, a holder for holding the substrate, and a first moving mechanism for moving the nozzle with respect to the holder along a first direction. The first direction extends within a plane that is parallel with the surface of the substrate. The present device also comprises a sensor for measuring the thickness distribution along the width of a piezo-electric band formed by moving the nozzle discharging the mixture along a first direction by means of the first moving mechanism, and a calculator for calculating the distance that the nozzle is to be moved with respect to the holder along a second direction based on the thickness distribution measured by the sensor. The second direction extends within a plane that is parallel with the surface of the substrate and intersects with the first direction. The present device also comprises a shifting mechanism for moving the nozzle with respect to the holder along the second direction by the calculated distance.

When this device is employed, it can feedback-control the shifting distance based on the thickness distribution along the width of the piezo-electric band. It is possible to follow the change in the amount of aerosol to be discharged from the nozzle over time. When this device is employed, it can form a piezo-electric film of a uniform thickness.

Piezo-electric films are often repeatedly formed. In a mass-production facility, piezo-electric films are formed on a series of substrates.

In this situation, the following method can be used. This method will repeatedly form a plurality of piezo-electric films on a plurality of substrates by repeating a cycle that forms a piezo-electric film on a surface of a substrate by discharging a mixture of gas and fine particles containing piezo-elctric material from a nozzle to the surface of the substrate.

One piezo-electric film will be formed in each cycle. Each cycle comprises (1) a step of calculating a shifting distance in a shifting step based on the thickness distribution of the piezo-electric film that was formed in the previous cycle, (2) a first moving step of moving the nozzle discharging the mixture with respect to the substrate along a first direction to form a first piezo-electric band extending along the first direction with a certain width, (3) a shifting step of moving the nozzle with respect to the substrate along a second direction by the calculated shifting distance, (4) a second moving step of moving the nozzle discharging the mixture with respect to the substrate along the first direction to form a second piezo-electric band extending along the first direction with a certain width, and (5) a step of repeatedly executing a combination of "the shifting step and the second moving step" after the second moving step.

In the above, the first direction extends within a plane that is parallel with the surface of the substrate, and the second direction extends within a plane that is parallel with the surface of the substrate and intersects with the first direction.

According to this method, the shifting distance to be used in the next piezo-electric film forming cycle will be adjusted based on the thickness distribution of the piezo-electric film formed immediately prior thereto. It is possible to follow the change in the amount of aerosol, and uniform piezo-electric films can be continuously formed.

A piezo-electric film can also be formed in which an upper piezo-electric film is laminated onto a lower piezo-electric film. In this situation, the following method can be used. This method comprises a step of forming a lower piezo-electric film by repeating a combination of "a first moving step of moving the nozzle discharging the mixture with respect to the substrate along a first direction, and a shifting step of shifting the nozzle with respect to the substrate along a second direction by a shifting distance", and a step of forming an upper piezo-electric film on a top surface of the lower piezo-electric film by repeating the combination of "the first moving step and the shifting step" on a predetermined area on which the lower piezo-electric film is already formed.

The present method is characterized in that the moving paths of the first moving step during the lower piezo-electric film formation are offset from the moving paths of the first moving step during the upper piezo-electric film formation by approximately half of the shifting distance along the second direction.

The thickness of the overlapping portion of two adjacent piezo-electric bands may be different than the other portions thereof. For example, the overlapping portion of two adjacent piezo-electric bands may be convex in shape, and the other portions thereof may be concave in shape. In addition, the reverse situation may also occur. According to the aforementioned method, the overlapping portion of two adjacent piezo-electric bands in the lower piezo-electric film will be offset with the overlapping portion of the two adjacent piezo-electric bands in the upper piezo-electric film. Because of this, overlapping the concave portion of the lower piezo-electric film and the concave portion of the upper piezo-electric film can be avoided, and overlapping the convex portion of the lower piezo-electric film and the convex portion of the upper piezo-electric film can be avoided Because of this, a stacked piezo-electric film having a uniform thickness can be formed.

What is claimed is:

1. A method of forming a piezo-electric film on a surface of a substrate by discharging mixture of gas and fine particles containing piezo-electric material from a nozzle to the surface of the substrate, the method comprising:
    a first moving step of moving the nozzle discharging the mixture with respect to the substrate along a first direction to form a first piezo-electric band extending along the first direction with a certain width, wherein the first direction extends within a plane that is parallel with the surface of the substrate;
    a measuring step of measuring thickness distribution along the width of the first piezo-electric band;
    a calculating step of calculating a shifting distance based on the thickness distribution measured by the measuring step;
    a shifting step of moving the nozzle with respect to the substrate along a second direction by the calculated shifting distance, wherein the second direction extends within the plane that is parallel with the surface of the substrate and intersects with the first direction; and
    a second moving step of moving the nozzle discharging the mixture with respect to the substrate along the first direction to form a second piezo-electric band extending along the first direction with a certain width;
    wherein the piezo-electric film is formed such that the first piezo-electric band and the second piezo-electric band are overlapped in the second direction, and
    wherein a large amount of the mixture is discharged from a central portion of the nozzle, and a small amount of the mixture is discharged from edge portions of the nozzle.

2. The method as in claim 1, wherein a combination of the shifting step and the second moving step is repeated after the second moving step is performed.

3. The method as in claim 1, wherein a combination of a measuring step of measuring thickness distribution along the width of the second piezo-electric band, the calculating step, the shifting step, and the second moving step is repeated after the second moving step is performed.

4. The method as in claim 1, wherein the first moving step, the shifting step and the second moving step are performed consecutively.

5. The method as in claim 1, further comprising: a step of moving the nozzle that is not discharging the mixture with respect to the substrate in an opposite direction of the first moving step, the step being performed between the first moving step and the shifting step.

6. The method as in claim 1, further comprising: a step of moving the nozzle that is not discharging the mixture with respect to the substrate in an opposite direction of the first moving step, the step being performed between the shifting step and the second moving step.

7. The method as in claim 1, wherein the nozzle stops discharging the mixture during the shifting step.

8. The method as in claim 1, wherein the nozzle continues to discharge the mixture during the shifting step.

9. The method as in claim 8, wherein the nozzle continues to discharge the mixture onto a mask during the shifting step, the mask being disposed on the substrate.

10. The method as in claim 8, wherein the moving speed of the shifting step is faster than the first moving step.

11. The method as in claim 10, wherein a ratio between the moving speed during the shifting step and the moving speed of the first moving step is determined based on a ratio between an opening length of the nozzle along the second direction and an opening length of the nozzle along the first direction.

12. The method as in claim 1, wherein moving speed of the first moving step and the second moving step is determined such that a piezo-electric band having 0.01 μm to 0.5 μm thickness is formed on the substrate.

13. The method as in claim 1, wherein moving speed of the first moving step is equal to moving speed of the second moving step.

14. The method as in claim 1, wherein the calculating step classifies the thickness distribution in accordance with its pattern and calculates the shifting distance based on the classified pattern.

15. The method as in claim 14, wherein the calculating step counts a number of peaks when the thickness distribution is classified into a mountain pattern and calculates the shifting distance based on the counted number of peaks.

16. The method as in claim 1, further comprising: a repeating step of a combination of the shifting step and the second moving step onto the surface of the substrate covered by the piezo-electric film formed in preceding steps.

17. A method of forming a plurality of piezo-electric films on a plurality of substrates by repeating a cycle that forms a piezo-electric film by discharging a mixture of gas and fine particles containing piezo-electric material from a nozzle to a surface of the substrate, each cycle comprising:
    a calculating step of calculating a shifting distance in a shifting step based on the thickness distribution of the piezo-electric film that was formed in the latest cycle;
    a first moving step of moving the nozzle discharging the mixture with respect to the substrate along a first direction to form a first piezo-electric band extending along the first direction with a certain width, wherein the first direction extends within a plane that is parallel with the surface of the substrate;
    a shifting step of moving the nozzle with respect to the substrate along a second direction by the calculated shifting distance, wherein the second direction extends within the plane that is parallel with the surface of the substrate and intersects with the first direction;
    a second moving step of moving the nozzle discharging the mixture with respect to the substrate along the first direction to form a second piezo-electric band extending along the first direction with a certain width; and a step of repeating a combination of the shifting step and the second moving step after the second moving step is performed, and wherein a large amount of the mixture is discharged from a central portion of the nozzle, and a small amount of the mixture is discharged from edge portions of the nozzle.

* * * * *